(12) United States Patent
Ramaswamy et al.

(10) Patent No.: US 9,281,044 B2
(45) Date of Patent: Mar. 8, 2016

(54) APPARATUSES HAVING A FERROELECTRIC FIELD-EFFECT TRANSISTOR MEMORY ARRAY AND RELATED METHOD

(71) Applicant: Micron Technology, Inc., Boise, ID (US)

(72) Inventors: D. V. Nirmal Ramaswamy, Boise, ID (US); Adam D. Johnson, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 224 days.

(21) Appl. No.: 13/897,037

(22) Filed: May 17, 2013

(65) Prior Publication Data

US 2014/0340952 A1   Nov. 20, 2014

(51) Int. Cl.
*G11C 11/22* (2006.01)

(52) U.S. Cl.
CPC .............. *G11C 11/221* (2013.01); *G11C 11/22* (2013.01); *G11C 11/2255* (2013.01); *G11C 11/2257* (2013.01)

(58) Field of Classification Search
CPC .............. G11C 11/22; G11C 11/2255; G11C 11/2257; G11C 11/223
USPC ................................ 365/145, 174, 175, 149
See application file for complete search history.

(56) References Cited

U.S. PATENT DOCUMENTS

| | | |
|---|---|---|
| 6,370,056 B1 | 4/2002 | Chen et al. |
| 6,477,078 B2 | 11/2002 | Hönigschmid et al. |
| 6,532,165 B1 | 3/2003 | Katori |
| 6,819,581 B2 | 11/2004 | Ito |
| 7,233,024 B2 | 6/2007 | Scheuerlein et al. |
| 7,433,233 B2 | 10/2008 | Chen et al. |
| 8,054,673 B2 | 11/2011 | Wang et al. |
| 8,148,759 B2 | 4/2012 | Wilson et al. |
| 8,169,827 B2 | 5/2012 | Guzzi et al. |
| 8,304,823 B2 | 11/2012 | Boescke |

(Continued)

FOREIGN PATENT DOCUMENTS

JP       2000-340760 A       12/2000

OTHER PUBLICATIONS

International Search Report, ISA/KR, International Application No. PCT/US2014/038110, Oct. 20, 2014, three (3) pages.

(Continued)

*Primary Examiner* — Han Yang
(74) *Attorney, Agent, or Firm* — TraskBritt

(57) ABSTRACT

An apparatus comprises field-effect transistor (FET) structures stacked horizontally and vertically in a three-dimensional memory array architecture, gates extending vertically and spaced horizontally between the plurality of FET structures, and a ferroelectric material separating the FET structures and the gates. Individual ferroelectric FETs (FeFETs) are formed at intersections of the FET structures, the gates, and the ferroelectric material. Another apparatus comprises a plurality of bit lines and word lines. Each bit line has at least two sides that are coupled with a ferroelectric material such that each bit line is shared by neighboring gates to faun a plurality of FeFETs. A method of operating a memory array comprises applying a combination of voltages to a plurality of word lines and digit lines for a desired operation for a plurality of FeFET memory cells, at least one digit line having plurality of FeFET memory cells accessible by neighboring gates.

33 Claims, 11 Drawing Sheets

(56) References Cited

U.S. PATENT DOCUMENTS

| 8,394,683 B2 | 3/2013 | Ramaswamy et al. | |
|---|---|---|---|
| 2007/0236979 A1 | 10/2007 | Takashima | |
| 2010/0072552 A1 | 3/2010 | Sunami et al. | |
| 2010/0073988 A1* | 3/2010 | Takahashi et al. | 365/145 |
| 2011/0188288 A1 | 8/2011 | Minami | |
| 2012/0195094 A1* | 8/2012 | Greco | G11C 11/22 365/145 |
| 2012/0275220 A1* | 11/2012 | Liu et al. | 365/185.03 |
| 2013/0043455 A1 | 2/2013 | Bateman | |
| 2013/0051150 A1* | 2/2013 | Roizin | H01L 29/7926 365/185.18 |

OTHER PUBLICATIONS

Written Opinion of the International Searching Authority, ISA/KR, International Application No. PCT/US2014/038110, Oct. 20, 2014, six (6) pages.

Ishiwara et al., Proposal of a Single-Transistor-Cell-Type Ferroelectric Memory Using an SOI Structure and Experimental Study on the Interference Problem in the Write Operation, Jpn. J. Appl. Phys., vol. 36, Part 1, No. 3B, Mar. 1997, pp. 1655-1658.

Ohshima, Jeff, State-of-the-Art Flash Memory Technology, Looking into the Future, GSA/Sematech Memory Conference, Apr. 16, 2012, 18 pages.

Sakai et al., Highly Scalable Fe(Ferroelectric)-NAND Cell with MFIS (Metal-Ferroelectric-Insulator-Semiconductor) Structure for Sub-10nm Tera-Bit Capacity NAND Flash Memories, Non-Volatile Semiconductor Memory Workshop, 2008 and 2008 International Conference on Memory Technology and Design, May 18-22, 2008, pp. 103-105.

Von Bieren et al., Presentation Summary, FeFET—The Memory Technology of Tomorrow? Oct. 17, 2006, 5 pages.

Yurchuk et al., HFO2-Based Ferroelectric Field-Effect Transistors with 260 nm Channel Length and Long Data Retention, Memory Workshop (IMW), 2012 4th IEEE International, May 20-23, 2012, 4 pages.

Office Action for Taiwanese Patent Application No. 103117392, issued Sep. 11, 2015, pages.

\* cited by examiner

APPARATUSES HAVING A FERROELECTRIC FIELD-EFFECT TRANSISTOR MEMORY ARRAY AND RELATED METHOD

FIELD

Embodiments of the present disclosure relate to ferroelectric field-effect transistor (FeFET) structures. In particular, embodiments of the present disclosure relate to memory arrays employing FeFETs.

BACKGROUND

Ferroelectric field-effect transistors have been considered for use in memory arrays in the form of non-volatile random access memory. For example, FIGS. 1A and 1B are schematic diagrams of a conventional memory array 100 including a plurality of FeFETs 110. In particular, the portion of the memory array 100 in FIG. 1A is the cross-section taken along line 1A of the top view shown in FIG. 1B. Each FeFET 110 includes a source region 112, a drain region 114, and a body region 116 (collectively referred to herein as an "FET structure") formed over an insulating substrate 130. Each FeFET 110 may include a gate 118 separated from the FET structure by a ferroelectric material 120. In other words, at a very general level, a FeFET may have a similar structure to a conventional FET, with the gate oxide being replaced by the ferroelectric material 120. Each FeFET 110 may comprise a memory cell for the memory array 100.

The memory array 100 includes the plurality of two-dimensional (planar) arrangement of FeFETs 110 over the insulating substrate 130. Each FeFET 110 may comprise a memory cell for the memory array 100 to store a state to be interpreted as data. The state of the FeFET 110 may be based on the polarization of the ferroelectric material 120 that may be switched in the presence of an external field. For example, the ferroelectric material 120 may exhibit a positive polarization (which may be interpreted as a "1") or a negative polarization (which may be interpreted as a "0") for an individual FeFET 110. In operation, the FeFET 110 may receive a combination of voltages to contacts coupled to the gate 118, the source region 112, and the drain region 114 in order to write to, erase, or read the state of the FeFET 110.

During a read operation, current 102 may flow through the FeFET 110 from the source region 112 to the drain region 114 of the selected FeFET 110. The conventional memory array 110 may have source contacts and drain contacts (not shown) that are on the same side of the memory array 100. As a result, the current 102 may flow from a first end 150 of the memory array 100 through the FeFET 110 and then return to the same first end 150 of the memory array 100. As a result, the current path may have a different length depending on the position of the FeFET 110 in the memory array 100. For example, the current 102 may have a path that is shorter for a FeFET 110 that is proximate the first end 150 and longer for a FeFET 110 that is proximate a second end 152 of the memory array 100. As a result, the series resistance along the current path may not be uniform when accessing one FeFET 110 in comparison to the accessing another FeFET 110 in the memory array 100. In addition, the conventional memory array 100 configured in a two-dimensional architecture may have feature sizes that are undesirably large, and which may not enable a cell density that is practical for use.

DETAILED DESCRIPTION

Figure 1A:
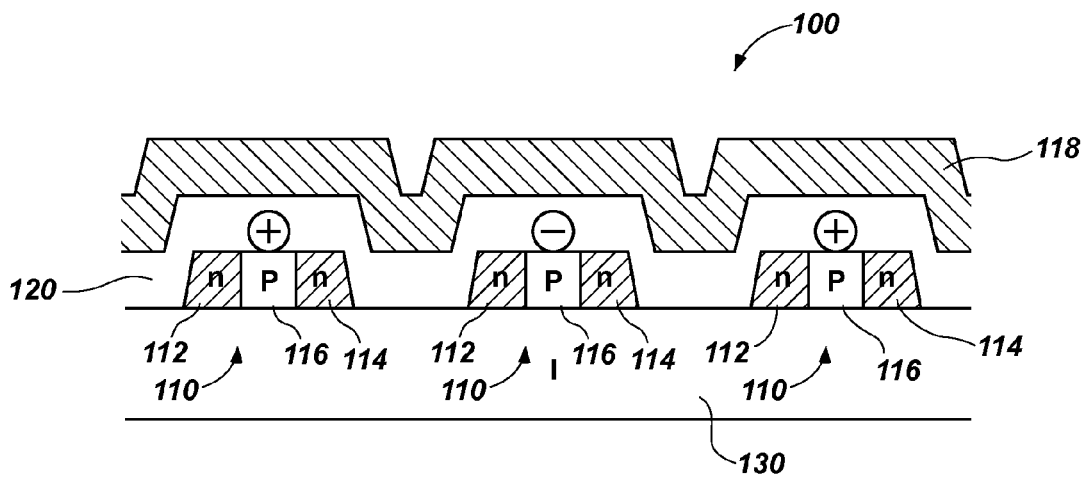
FIGS. 1A and 1B are schematic diagrams of a conventional memory array including a plurality of FeFETs.

In the following detailed description, reference is made to the accompanying drawings that form a part hereof, and in which is shown by way of illustration specific embodiments of the present disclosure. These embodiments are described with specific details to clearly describe the embodiments of the present disclosure. However, the description and the specific examples, while indicating examples of embodiments of the present disclosure, are given by way of illustration only and not by way of limitation. Other embodiments may be utilized and changes may be made without departing from the scope of the disclosure. Various substitutions, modifications, additions, rearrangements, or combinations thereof may be made and will become apparent to those of ordinary skill in the art. In addition, features from one embodiment may be combined with features of another embodiment while still being encompassed within the scope of the disclosure as contemplated by the inventor.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed or that the first element must precede the second element in some manner. In addition, unless stated otherwise, a set of elements may comprise one or more elements.

It should also be understood that discussion herein regarding a specific number of memory cells should not be interpreted to limit the number of memory cells that may be present in a memory array or any portion thereof. Rather, specific numbers may be referred to when discussing the depicted embodiments. Embodiments of the present disclosure, however, may include any number of memory cells, which may approximately equal the number of FeFETs formed by the 3D memory array architecture. In some embodiments, at least some of the memory cells may be reserved for use as replacement memory cells to replace other memory cells within the memory array, such as if memory cells are determined to be defective in some way. Thus, for some embodiments, the overall capacity of the memory array may be less than the total number of memory cells. In addition, the memory array may be used to replace another memory array.

The materials and structures described herein may be formed by any suitable technique including, but not limited to, spin coating, blanket coating, chemical vapor deposition (CVD), atomic layer deposition (ALD), plasma enhanced ALD, or physical vapor deposition (PVD), unless otherwise specified. Depending on the specific material to be formed, the technique for depositing or growing the material may be selected by a person of ordinary skill in the art. Structural elements may be formed in the locations and configurations described herein using conventional semiconductor fabrication techniques. While the materials described and illustrated herein may be formed as layers, the materials are not limited thereto and may be formed in other three-dimensional configurations.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

Embodiments of the present disclosure include apparatuses comprising FeFET memory arrays. For example, a plurality of FET structures may be stacked horizontally and vertically in a three-dimensional memory array architecture, a plurality of gates extending vertically and spaced horizontally between the plurality of FET structures, and a ferroelectric material separating the plurality of FET structures and the plurality of gates. Individual ferroelectric FETs (FeFETs) may be formed at intersections of the plurality of FET structures, the plurality of gates, and the ferroelectric material. Some embodiments may include a first vertical FeFET stack including a first plurality gates that are separated from a first FET structure by a first ferroelectric material, and a second vertical FeFET stack including a second plurality gates that are separated from a second FET structure by a second ferroelectric material. The first vertical FeFET stack and the second FeFET stack may be stacked horizontally and separated by a dielectric material. Some embodiments may include a three-dimensional memory array having a plurality of FeFET memory cells formed at intersections of ferroelectric material coupled with a plurality of bit lines and a plurality of word lines. The plurality of FeFET memory cells may be formed along vertical strings of the three-dimensional memory array, wherein the vertical strings couple with memory cell gates coupled with the plurality of word lines. The vertical strings may each include a vertical channel surrounded by the ferroelectric material.

Figure 2:
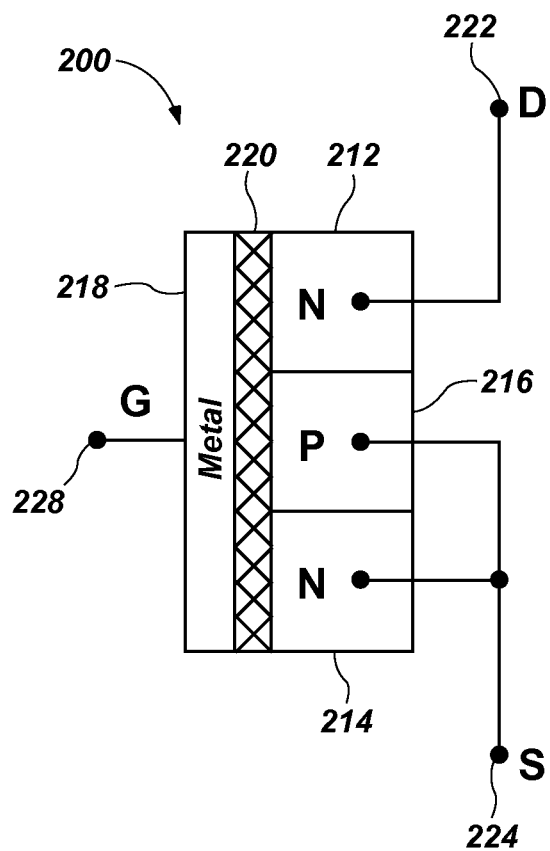
FIG. 2 is a schematic diagram of a FeFET according to an embodiment of the present disclosure.

FIG. 2 is schematic diagram of a FeFET 200 according to an embodiment of the present disclosure. The FeFET 200 may be a memory cell of a larger memory array (see, e.g., FIGS. 3A through 10). The FeFET 200 includes a drain region 212, source region 214, and body region 216 coupled to a gate 218 that is separated by a ferroelectric material 220. The drain region 212 may be coupled to a drain contact 222, the source region 214 may be coupled to a source contact 224, and the gate 218 may be coupled to a gate contact 228. The source region 214 and the body region 216 may be tied together to the same source contact 224, which may reduce the number of contacts over conventional FeFET memory cells.

The ferroelectric material 220 is a dielectric material (e.g., hafnium oxide (HfOx)) that may exhibit polarization (e.g., a displacement of oppositely charged ions and create a dipole moment) that is switchable by an external field. In addition, the remnant polarization of the ferroelectric material 220 may not vanish after turning off the external field. As a result, the polarization of the ferroelectric material 220 may be interpreted as the state (e.g., "1" or "0") of the memory cell. The polarization may be determined by measuring the resistivity of the FeFET 200, which resistivity is dependent on the polarization state of the ferroelectric material 220. In other words, the state of the polarization may effectively show up as a threshold voltage (Vt) shift in the FeFET 200 based on the polarization of the ferroelectric material 220, which may be sensed by detecting the threshold voltage of the FeFET 200 under a low bias. Because the remnant polarization of the ferroelectric material 220 may remain (i.e., be non-volatile), the FeFET 200 may not need to be refreshed as with other RAM technologies that employ cell capacitors as a storage element.

The drain region 212, the source region 214, and the body region 216 may be formed from doped semi-conductive material (e.g., n-type semi-conductive material, p-type semi-conductive material). Although the drain region 212, the source region 214, and the body region 216 are shown in FIG. 2 (and other figures herein) as an npn structure, some embodiments may include a pnp structure.

In operation, the FeFET 200 may be read, written to, erased, etc., according to the bias voltage applied to the drain contact 222, source contact 224, and the gate contact 228. In particular, the polarity of the ferroelectric material 220 may be changed (e.g., write, erase) or sensed (e.g., read) depending on the desired operation. For example, a write operation may include applying a positive gate-source voltage ($V_{GS}$) (e.g., $V_G$=3V, $V_S$=0V, $V_D$=0V) that has a larger amplitude than the coercive field of the ferroelectric material 220 to cause a first polarization to be present within the adjacent ferroelectric material 220. An erase operation may include applying a negative gate-source voltage ($-V_{GS}$) (e.g., $V_G$=0V, $V_S$=3V, $V_D$=3V) that has a larger amplitude than the coercive field of the ferroelectric material 220 to cause a second polarization to be present within the adjacent ferroelectric material 220. Although termed "erase," the erase operation may simply be considered another write operation that writes the opposite state to the FeFET 200. Either polarization (i.e., positive or negative) may be interpreted as either a "1" or a "0, " as long as the two polarizations are interpreted differently from each other. A read operation may include applying a gate-source voltage ($V_{GS}$) (e.g., VG=1.5V, $V_S$=1V, VD=1V) that does not have a larger amplitude than the coercive field of the ferroelectric material 220.

Because of the dependence of the source-drain resistivity (i.e., the channel resistivity) on the polarization state of the ferroelectric material 220, the source-drain resistivity may be measured to determine the state of the FeFET 200. For example, if the electrons in the body region 216 are depleted (e.g., after $-V_{GS}$ has been applied causing a positive polarization of the ferroelectric material 220), the resistivity between the source region 214 and the drain region 212 is increased. If the electrons in the body region 216 results in an accumulation of electrons in the channel (e.g., $V_{GS}$ is applied causing a negative polarization in the ferroelectric material 220), the resistivity between the source region 214 and the drain region 212 is decreased. A read operation may include sensing the current received by the source contact 224 and determining the resistivity in response thereto.

The above operations are a based on a V/3 selection scheme, by which a memory cell is selected (written to) if the $V_{GS}=\pm V$, and the memory cell is not selected if $V_{GS}=\pm V/3$ or 0V. In the above example, V=3, such that 1=V/3. Other sensing schemes (e.g., V/2 selection scheme) may also be employed as may be known by those of ordinary skill in the art.

Additional embodiments of the present disclosure include memory arrays that include a plurality of FeFETs 200. When employed in a memory array, the drain region 212 may be coupled to a bit line (coupled to the drain regions for a plurality of FeFETs), and the gate 218 may be coupled to a word line (coupled to the gates for a plurality of FeFETs). The appropriate bit line and word line may be selected to access a desired memory cell. At times, for convenience, the drain region 212 may be referred to as the bit line (because it is coupled to the bit line contacts) and the gates 218 may be referred to as the word line (because it is coupled to the word line contacts).

The memory arrays have a three-dimensional (3D) architecture, which may result in a relatively high density 3D FeFET memory array that has random access. For example, in some embodiments, the memory array may include a $2F^2/n$ cell, where "F" is the minimum device feature size and "n" is the number of decks (described below). As a result, the memory array may achieve relatively higher cell density, lower power, and better cycling compared with other types of conventional memory arrays, while maintaining random access.

Figure 3A:
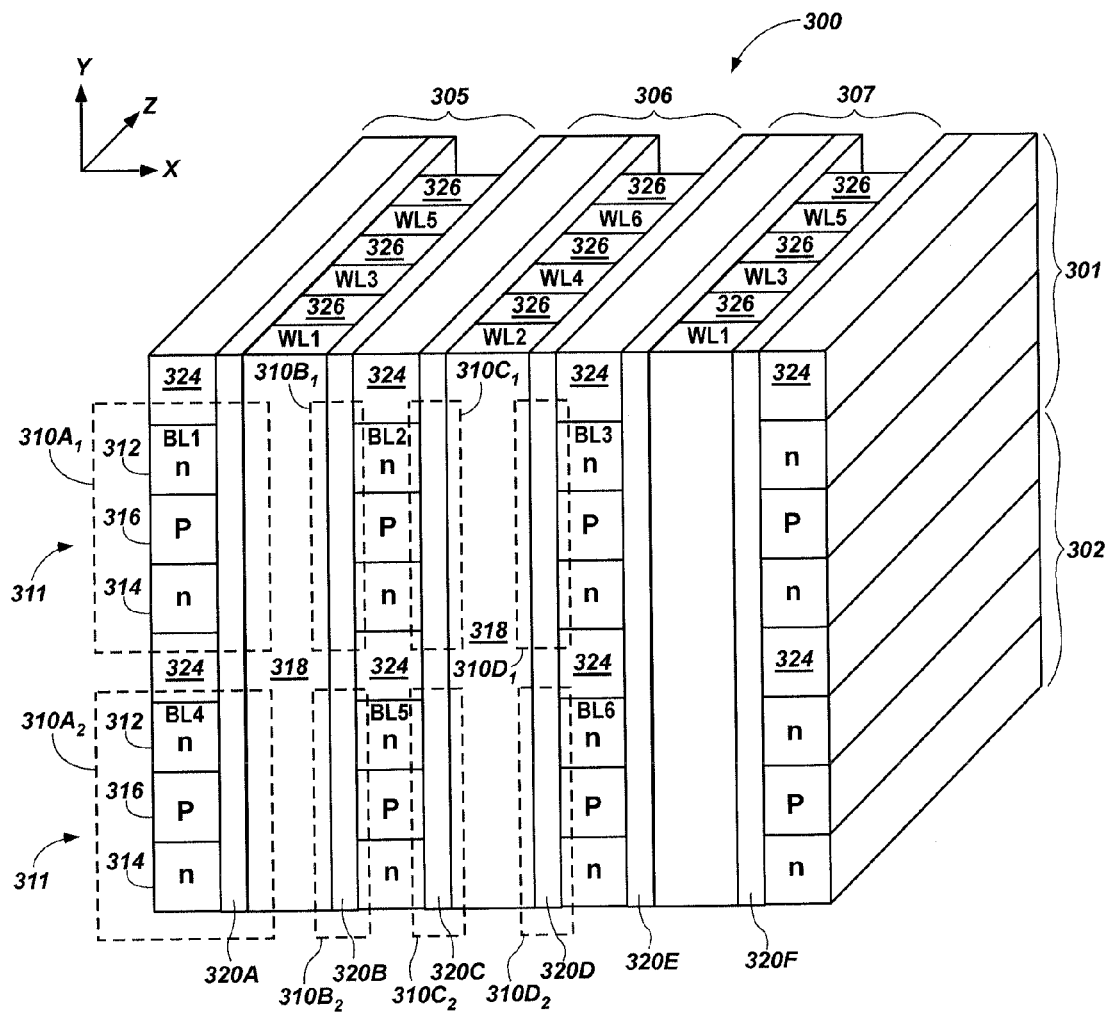
FIG. 3A is a perspective view of a schematic diagram of a memory array according to an embodiment of the present disclosure.

FIG. 3A is a perspective view of a schematic diagram of a memory array 300 according to an embodiment of the present disclosure. The x-axis, y-axis, and z-axis are provided in FIG. 3A to assist with the description to provide a point of reference and direction for certain features relative to each other. These axes are defined according to the orientation shown in FIG. 3A, which is not to be interpreted as requiring any particular orientation of the memory array 300 when fabricated or put into use. When oriented as shown, the direction along the x-axis will also be referred to as "horizontal," and the direction along the y-axis will be referred to as "vertical."

The memory array 300 includes a plurality of memory cells configured in a three-dimensional (3D) structure, which may roughly resemble a cube (e.g., 3D square) or cuboid (e.g., 3D rectangle) shape. Each memory cell may be configured as a FeFET. Therefore, at times, the terms "memory cell" and "FeFET" may be used interchangeably. As an example of one such memory cell, a FeFET $310A_1$ includes a drain region 312, a source region 314, and a body region 316 coupled to a gate 318 that is separated by a ferroelectric material 320A. The drain region 312, the source region 314, and the body region 316 may collectively be referred herein to as an FET structure 311. Although each feature of each memory cell is not expressly labeled herein, each of the FeFETs $310A_{1,2}$, $310B_{1,2}$, $310C_{1,2}$, $310D_{1,2}$ may be configured similarly. In addition, it is recognized that only some of the FeFETs (e.g., FeFETs $310A_{1,2}$, $310E3_{1,2}$, $310C_{1,2}$, $310D_{1,2}$) of the memory array 300 are labeled in FIG. 3A, for convenience. Additional memory cells may be present at other locations where other FET structures 311, gates 318, and ferroelectric material 320A, 320B, 320C, 320D, 320E, 320F form FeFETs. The FET structures 311 may be configured as npn structures (as shown in FIG. 3A); however, some embodiments of the present disclosure may include FET structures 311 that are configured as pnp structures (not shown).

When oriented as shown in FIG. 3A, a plurality of FET structures 311 may be stacked vertically, with each FET structure 311 being separated by a dielectric material 324. For example, the FET structure 311 of the first FeFET $310A_1$ may be vertically stacked on the FET structure 311 of the second FeFET $310A_2$, and separated by the dielectric material 324. The FeFETs (e.g., FeFET $310A_1$, FeFET $310A_2$) stacked in the same vertical FeFET stack (e.g., vertical FeFET stack 305) may share a common gate 318. In other words, an individual gate 318 may extend in the y-direction such that the individual gate 318 may be shared by different FET structures 311. The corresponding ferroelectric material (e.g., ferroelectric material 320A) may also be shared by FeFETs (e.g., FeFET $310A_1$, FeFET $310A_2$) of the same vertical FeFET stack (e.g., vertical FeFET stack 305). The gate 318 and the ferroelectric material (e.g., ferroelectric material 320A) may be offset (in the x-direction) to a side of the FET structure 311. Thus, a FeFET stack 305, 306, 307 includes the FETs in a single y-z plane.

An individual FET structure 311 may extend in the z-direction such that the individual FET structure 311 may be associated with a plurality of different gates 318. The ferroelectric material (e.g., ferroelectric material 320A) may separate each of the different gates 318 and the FET structure 311. As a result, individual memory cells may be formed along the individual FET structure 311 at each intersection where a different gate 318 is located. The different gates 318 may be parallel in the y-direction, and separated from each other in the z-direction by a dielectric material 326. The number of individual FeFETs in a vertical FET stack (e.g., vertical FeFET stack 305) may depend on the number of discrete gates 318 that are present in the z-direction as well as the number of FET structures 311. For example, the vertical FeFET stack 305 shown in FIG. 3A includes three discrete gates 318 and two FET structures 311. As a result, the vertical FeFET stack 305 may include six memory cells along the ferroelectric material 320A.

In forming the 3D memory array architecture, vertical FeFET stacks 305, 306, 307 may be further stacked horizontally to form additional FeFETs (e.g., FeFETs $310B_{1,2}$, $310C_{1,2}$, $310D_{1,2}$). Each vertical FeFET stack may be separated from its respective neighboring vertical FeFET stacks by a ferroelectric material. For example, the first vertical FeFET stack 305 and the second vertical FeFET stack 306 may be separated by the ferroelectric material 320B. Similarly, the second vertical FeFET stack 306 and the third vertical FeFET stack 307 may be separated by the ferroelectric material 320D.

The vertical FeFET stacks 306, 307 shown in FIG. 3A may each include six memory cells along the ferroelectric material 320C, 320E, respectively. Because the material separating neighboring vertical FeFET stacks 305, 306, 307 may be a ferroelectric material (e.g., ferroelectric material 320B, 320D), additional memory cells may be formed at the intersections between neighboring vertical FeFET stacks 305, 306, 307. For example, FeFETs $310B_{1,2}$ may be formed by the FET structures 311 of the second vertical FeFET stack 306, the second ferroelectric material 320B, and the gate 318 of the first vertical FeFET stack 305. Similarly, FeFETs $310D_{1,2}$ may be formed by the FET structures 311 of the third vertical FeFET stack 307, the third ferroelectric material 320C, and the gate 318 of the second vertical FeFET stack 306. As a result, memory cells may be formed on each side of the gate 318, because each gate 318 may have ferroelectric material coupled to the FET structures 311 on each side of the gate 318.

Individual memory cells may be selected for an operation (e.g., read, write, erase, etc.) by applying an appropriate combination of voltages to the gate 318, drain region 312 and source region 314. Each gate 318 may also be considered an "access line" (e.g., word line) that is used to apply a common voltage to the gate 318 of the FeFETs (e.g., FeFET $310A_1$, FeFET $310A_2$) of the same row. Likewise, the drain region 312 may be considered an "access line" (e.g., bit line) that is used to apply a common voltage to the drain regions 312 of the same column. The terms "rows" and "columns" are not intended to require a particular orientation, but are merely used as a convenient way of distinguishing the difference between an access line for the drain region 312 and the access line for the gates 318. For convenience, the terms "word line" (WL) and "bit line" (BL) will be used. The term "digit line" is sometimes used in the art for a bit line. Rows and columns are logical configurations and do not necessarily mean physical rows and columns. In the context of a 3D memory array, rows and columns may include memory cells that may be in different planes according to the word line and bit line contacting scheme.

As used herein, the term "deck" refers to a plurality of FeFETs stacked in the x-z plane. In other words, FeFETs of the same deck 301, 302 may have FET structures 311 of different vertical FeFET stacks 305, 306, 307, but that are parallel to each other along the same x-axis. For example, the first deck 301 includes FeFETs $310A_1$, $310B_1$, $310C_1$, $310D_1$, and the second deck 302 includes FeFETs $310A_2$, $310B_2$, $310C_2$, $310D_2$. Embodiments of the present disclosure may include any number of decks.

The neighboring gates 318 that are parallel along the same x-axis may not be part of the same word line. In other words, neighboring gates 318 that are parallel along the same x-axis do not receive the same voltage as each other during operation. For example, the gates 318 for a first group of gates 318 parallel along the same x-axis (within the same x-y plane) are part of word lines WL1, WL2, WL1, respectively. As a result, in some embodiments, the word lines (e.g., WL1, WL2) may alternate repeatedly moving along the memory array 300 in the x-direction. Similarly, moving back one level in the z-direction to a second x-y plane, the gates 318 of a second group of gates 318 may be part of word lines WL3, WL4, WL3, respectively. In addition, the gates 318 of a third group of gates 318 may be part of word lines WL5, WL6, WL5, respectively. In some embodiments, the word lines that are parallel each other along the same x-axis may have more than two word lines (e.g., WL1, WL2, WL3, etc.) that may or may not repeat, or that may have no particular repeatable pattern.

The memory array 300 of FIG. 3A is a simplified schematic diagram, and it should be recognized that additional elements may be coupled therewith to facilitate operation thereof. For example, contact elements may be coupled with the memory array 300 for applying voltages to the various elements (e.g., word lines, bit lines, etc.) of the memory array 300 to perform operations (e.g., read, write, erase, etc.) thereon. The memory array 300 may also include a control unit (not shown) that is coupled with the gate 318, the drain region 312 and the source region 314. Such a control unit may include at least one of string driver circuitry, pass gates, circuitry for selecting gates, circuitry for selecting conductive lines (e.g., bit lines, word lines), circuitry for amplifying signals, and circuitry for sensing signals.

In operation, the memory cells may be written to, erased, or read from in a manner similar to that discussed above with respect to FIG. 2. In some embodiments, a method of operating a FeFET memory array may comprise applying a combination of voltages to a plurality of word lines and digit lines for a desired operation for a plurality of FeFET memory cells of a three-dimensional FeFET memory array, at least one digit line having plurality of FeFET memory cells accessible by neighboring gates. In particular, an appropriate combination of voltages may be applied to the contacts (not shown) such that the word lines and bit lines select the appropriate memory cell for the desired operation. For example, the FeFET $310A_1$ may be selected by applying the appropriate voltages to the word line WL1 and the bit line BL1 for the desired operation according to the selection scheme (e.g., V/3, V/2, etc.) that is used. While the FeFET $310A_1$ is selected, the other FeFETs $310A_2$, $310B_{1,2}$, $310C_{1,2}$, $310D_{1,2}$ may not be selected according to the selection scheme that is used.

Figure 3B:
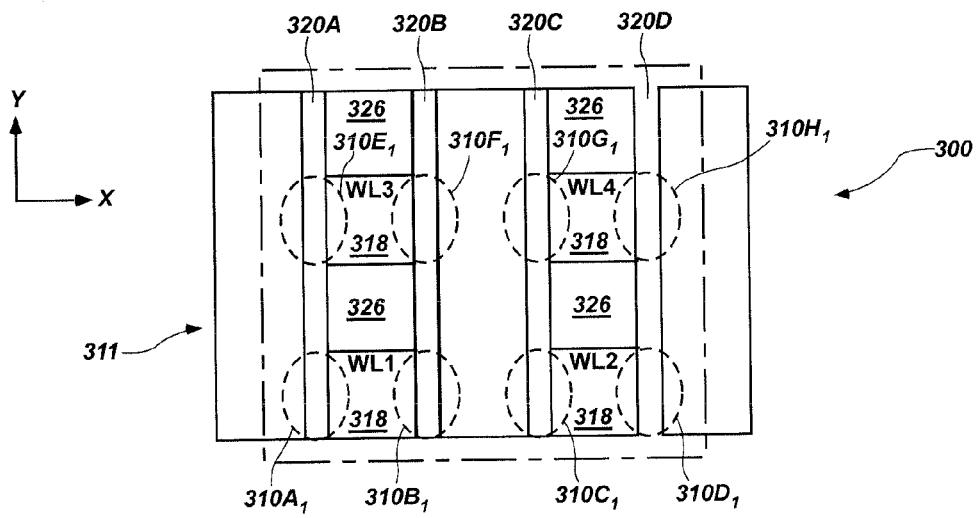
FIG. 3B is a top view of a portion of the memory array of FIG. 3A.

FIG. 3B is a top view of a portion of the memory array 300 of FIG. 3A. As with FIG. 3A, reference axes (in this case, the x-axis and z-axis) are provided to assist with the description to provide a point of reference and direction for certain features relative to each other. In particular, FIG. 3B shows the FeFETs $310A_1$-$310H_1$ as an exemplary cross-section of the memory array 300 across the first deck 301. However, it should be recognized that any number of FeFETs may exist in the y-direction (i.e., according to the number of decks 301, 302). As shown in FIG. 3A, there are two decks 301, 302. However, the memory array 300 may include any number of decks.

As discussed above, the neighboring gates 318 that are parallel along the same x-axis may not be part of the same word line. In other words, each FET structure 311 may be coupled to gates 318 of different word lines on the opposing sides of the FET structure 311 (in contrast with the embodiment of FIG. 4B below, where neighboring FET structures 311 may be coupled to gates 318 of the same word lines). As a result, each bit line may have two memory cells that are independently accessed. For example, bit line BL2 (FIG. 3A) may form part of FeFET $310B_1$ and FeFET $310C_1$. Because each of the neighboring gates 318 are members of (e.g., attached to, coupled with) different word lines (e.g., WL1, WL2), the states of FeFET $310B_1$ and FeFET $310C_1$ may not be accessed together, and, therefore, may be independent of each other. Other groups of gates 318 may have neighboring gates 318 that are part of different word lines as well and may be configured in a similar manner. As a result, the memory array 300 may have greater capacity and/or higher density than the memory array 400 of FIGS. 4A and 4B described below.

Therefore, an apparatus may comprise a three-dimensional FeFET memory array having a plurality of bit lines and a plurality of word lines, wherein each bit line of the plurality of bit lines has at least two sides that are coupled with a ferroelectric material such that each bit line is shared by neighboring gates to form a plurality of FeFETs.

Figure 4A:
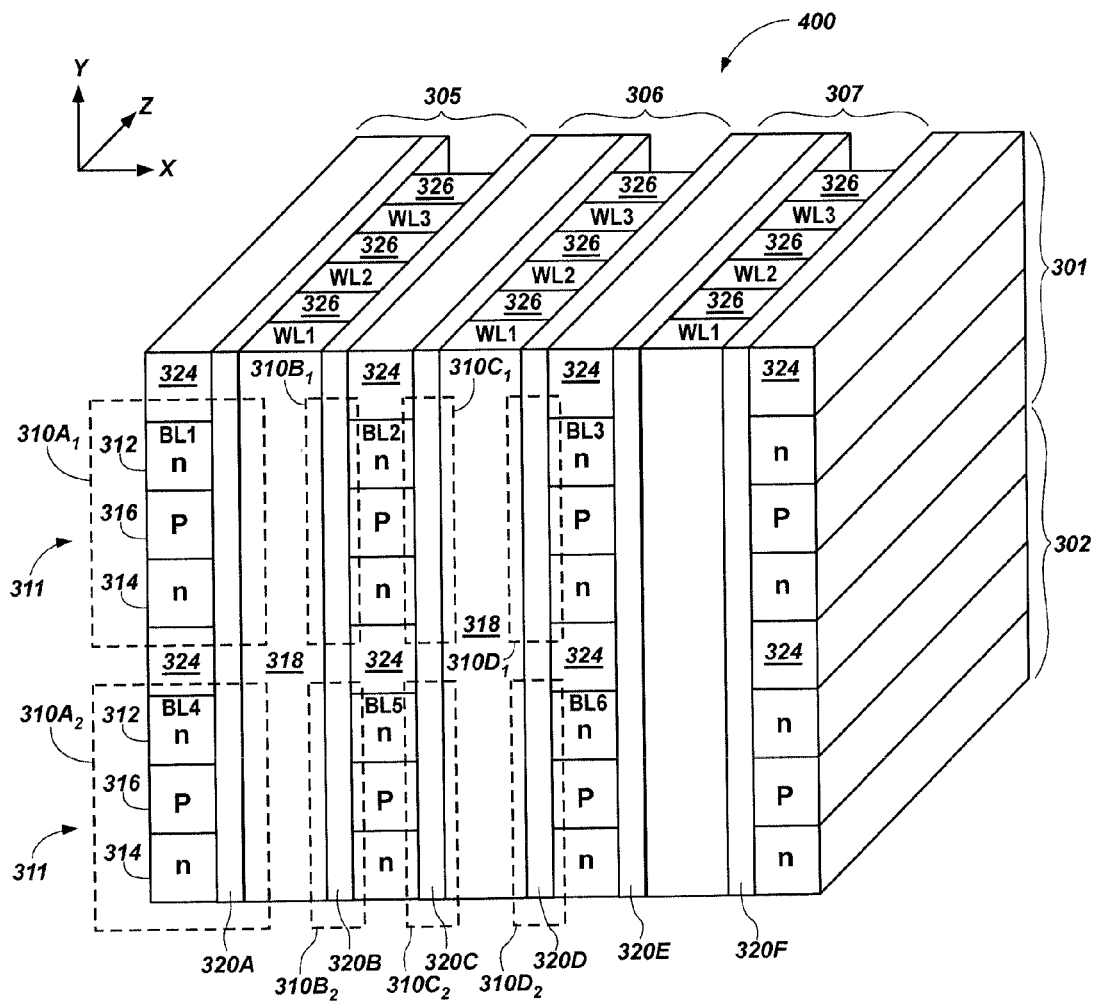
FIG. 4A is a perspective view of a schematic diagram of a memory array according to another embodiment of the present disclosure.

FIG. 4A is a perspective view of a schematic diagram of a memory array 400 according to another embodiment of the present disclosure. The memory array 400 includes a plurality of memory cells configured in a 3D structure that is generally similar to the memory array 300 of FIG. 3A. Thus, the majority of reference numerals and general construction of FIG. 4A remain the same as in FIG. 3A. The difference between FIG. 3A and FIG. 4A is in the configuration of the word lines.

As shown in FIG. 4A, the gates 318 that are parallel to each other in the x-y plane may be part of the same word line and receive the same voltage signal (e.g., by being coupled to a common contact). For example, the gates 318 that are labeled as WL1 may be coupled to a common contact such that they will receive the same voltage signal. Similarly, the gates 318 that are labeled as WL2 may be coupled to a common contact such that they will receive the same voltage signal, the gates 318 that are labeled as WL3 may be coupled to a common contact such that they will receive the same voltage signal, and so on. Such contacts (not shown in FIG. 4A) may extend in the x-direction across an outer surface (or in some embodiments an intermediate position) of the memory array 400 and electrically couple with the corresponding gates 318.

Figure 4B:
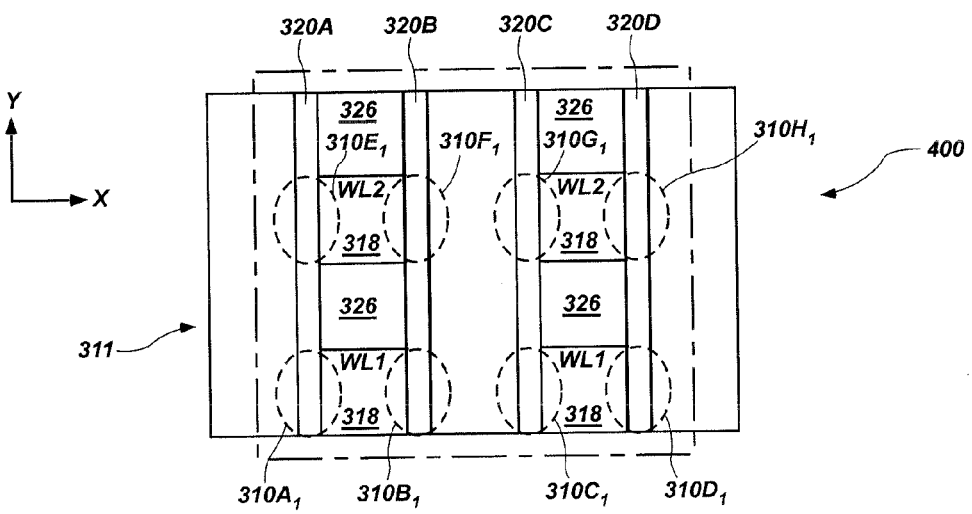
FIG. 4B is a top view of a portion of the memory array of FIG. 4A.

FIG. 4B is a top view of a portion of the memory array 400 of FIG. 4A. In particular, FIG. 4A shows the FeFETs 310A$_1$-310H$_1$. As discussed above, each gate 318 that is parallel in the x-direction may be part of the same word line. If neighboring gates 318 are part of the same word line (WL), the FeFETs on each side of the same FET stack 311 may be accessed (e.g., written to, read from, etc.) together because they are part of the same bit line (BL) and the same word line (WL). For example, FeFET 310B$_1$ and 310C$_1$ may be accessed together if word line WL1 and bit line BL2 (FIG. 3A) are appropriately activated. Similarly, FeFET 310F$_1$ and 310G$_1$ may be accessed together when the appropriate voltages are applied to word line WL2 and bit line BL2 (FIG. 3A).

In other words, the state (i.e., polarization) of each FeFET that is coupled to the same bit line may not be independent of each other. As a result, a memory cell may be wasted in the sense that it cannot be independently accessed. Even though the ferroelectric material 320B separates neighboring vertical FeFET stacks 305, 306 and forms additional FeFETs 310B$_1$, 310F$_1$, it is almost as if the additional FeFETs 310B$_1$, 310F$_1$ do not exist. In some embodiments, the ferroelectric material 320B that separates neighboring vertical FeFET stacks 305, 306 (and other similarly situated ferroelectric material 320D, etc.) may be replaced by a dielectric material that is non-ferroelectric, which may not necessarily reduce the capacity of the memory array 400 because each bit line (BL) would effectively have one memory cell available.

Of course, there may still be some advantage to having the ferroelectric material 320B, 320D remain in such an embodiment that includes neighboring FeFETs to be accessed together. For example, the added redundancy may improve reliability. In such embodiments, the FeFET 310B$_1$ may serve as a replacement memory cell for FeFET 310C$_1$, and vice versa. In other words, because FeFET 310B$_1$ and FeFET 310C$_1$ are accessed together, if one is defective the other may remain operational.

Embodiments of the present disclosure may include various contacting schemes for coupling the gates 318 of the word lines together. FIGS. 5 through 8 are top views of a schematic diagram of memory arrays showing various contacting schemes for the word line contacts. The word line contacts may be formed at the end (e.g., on top) of the 3D structure for the memory array; however, it is contemplated that one or more word line contacts may be buried within the 3D structure of the memory array. The memory arrays shown in FIGS. 5 through 8, in particular, have been simplified in order to focus the discussion on the contacting schemes. As a result, certain features (e.g., ferroelectric material, dielectric material, etc.) may not be depicted and/or labeled, but which may be otherwise be visible from such a view for the respective figure.

Figure 5:
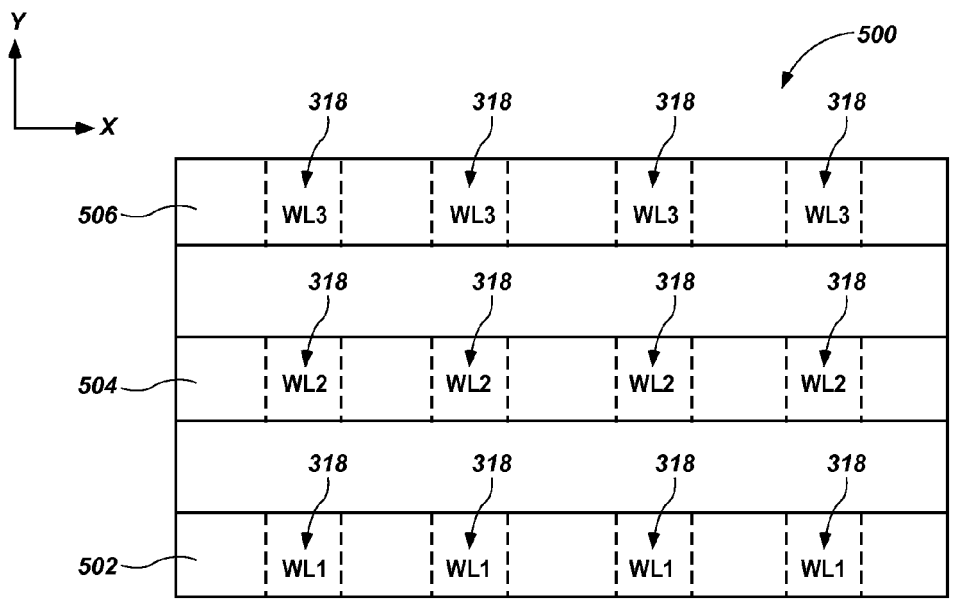
FIGS. 5 through 7 are top views of a schematic diagram of memory arrays showing various contacting schemes for the word line contacts.

FIG. 5 shows a contacting scheme for a memory array 500 in which the gates 318 along the same x-axis are part of the same word line. For example, the memory array 500 may be configured similarly to the memory array 300 of FIG. 3A. In particular, the first group of gates 318 along the same x-axis may be part of word line WL1. Moving back in the z-direction, the second group of gates 318 that are parallel along the same x-axis may be part of word line WL2. Moving back yet again in the z-direction, the third group of gates 318 that are parallel along the same x-axis may be part of word line WL3.

A first word line contact 502 extends along the memory array 500 such that the first word line contact 502 couples each of the gates 318 that are part of the first word line WL1. A second word line contact 504 extends along the memory array 500 such that the second word line contact 504 couples each of the gates 318 that are part of the second word line WL2. A third word line contact 506 extends along the memory array 500 such that the third word line contact 506 couples each of the gates 318 that are part of the third word line WL3, and so on. Each of the word line contacts 502, 504, 506 may be substantially linear and extend parallel to each other in the x-direction. In addition, each of the word line contacts 502, 504, 506 may be formed directly over its respective group of gates 318 that are part of the same word line.

As discussed above, if neighboring gates 318 are part of the same word line, the FeFETs formed on each side of the same bit line may be accessible together when each side of the bit line has a ferroelectric material associated therewith. As a result, neighboring FeFETs having a common bit line may not be independently accessible.

Figure 6:
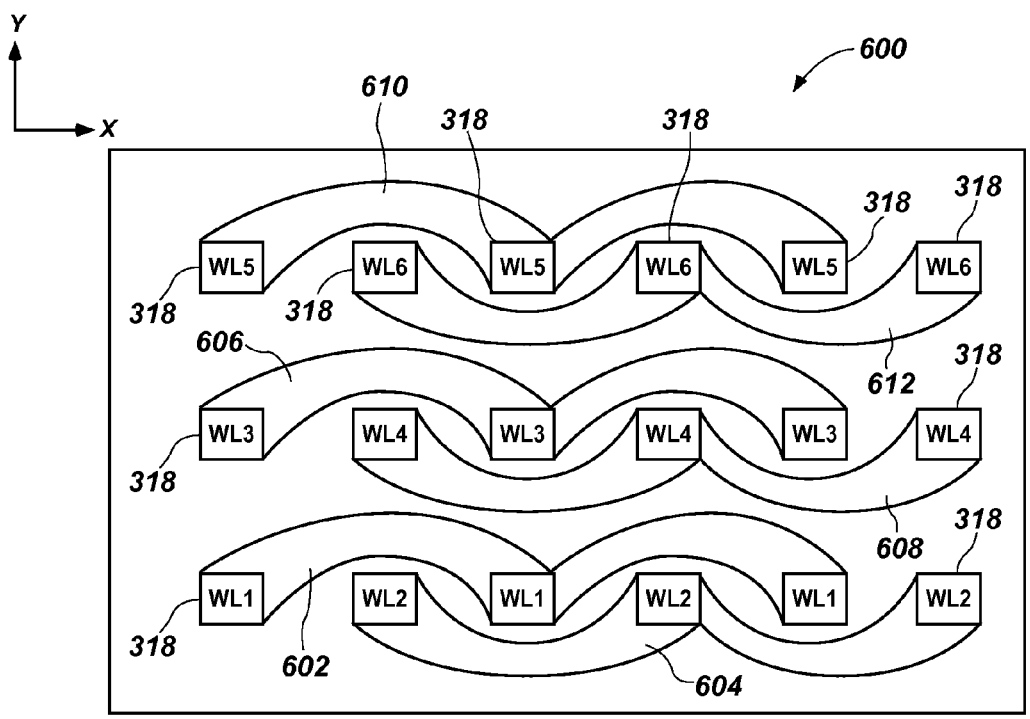

FIG. 6 shows a contacting scheme for a memory array 600 including a plurality of word lines. For example, the memory array 600 may be configured similarly to the memory array 400 of FIG. 4A. The gates 318 along the same x-axis may be part of different word lines. In particular, neighboring gates 318 may be part of the different word lines. For example, the first group of gates 318 along the same x-axis may be part of either word line WL1 or word line WL2. As shown in FIG. 6, the gates 318 may alternate between word line WL1 and word line WL2 moving in the x-direction. Moving back in the z-direction, the second group of gates 318 that are parallel along the same x-axis may be part of either word line WL3 or word line WL4. Moving back yet again in the z-direction, the third group of gates 318 that are parallel along the same x-axis may be part of either word line WL5 or word line WL6.

A first word line contact 602 extends along the memory array 600 such that the first word line contact 602 couples each of the gates 318 that are part of the first word line WL1. A second word line contact 604 extends along the memory array 600 such that the second word line contact 604 couples each of the gates 318 that are part of the second word line WL2. A third word line contact 606 extends along the memory array 600 such that the third word line contact 606 couples each of the gates 318 that are part of the third word line WL3. A fourth word line contact 608 extends along the memory array 600 such that the fourth word line contact 608 couples each of the gates 318 that are part of the fourth word line WL4. A fifth word line contact 610 extends along the memory array 600 such that the fifth word line contact 610 couples each of the gates 318 that are part of the fifth word line WL5. A sixth word line contact 612 extends along the memory array 600 such that the sixth word line contact 612 couples each of the gates 318 that are part of the sixth word line WL6, and so on. Each of the word line contacts 602, 604, 606, 608, 610, 612 may extend across the memory array 600 having a curved (e.g., arcuate) shape to avoid contact with the neighboring gate 318. For a group of gates 318 along the same x-axis, one word line contact (e.g., word line contacts 602, 606, 610) may curve in a first direction around its neighboring gates 318, while the other word line contact (e.g., word line contacts 604, 608, 612) may curve in a second direction around its neighboring gates 318.

As discussed above, if neighboring gates 318 are part of different word lines, the FeFETs formed on each side of the same bit line may be independently accessible, which may provide for further density and/or capacity in the memory array 600.

Figure 7:
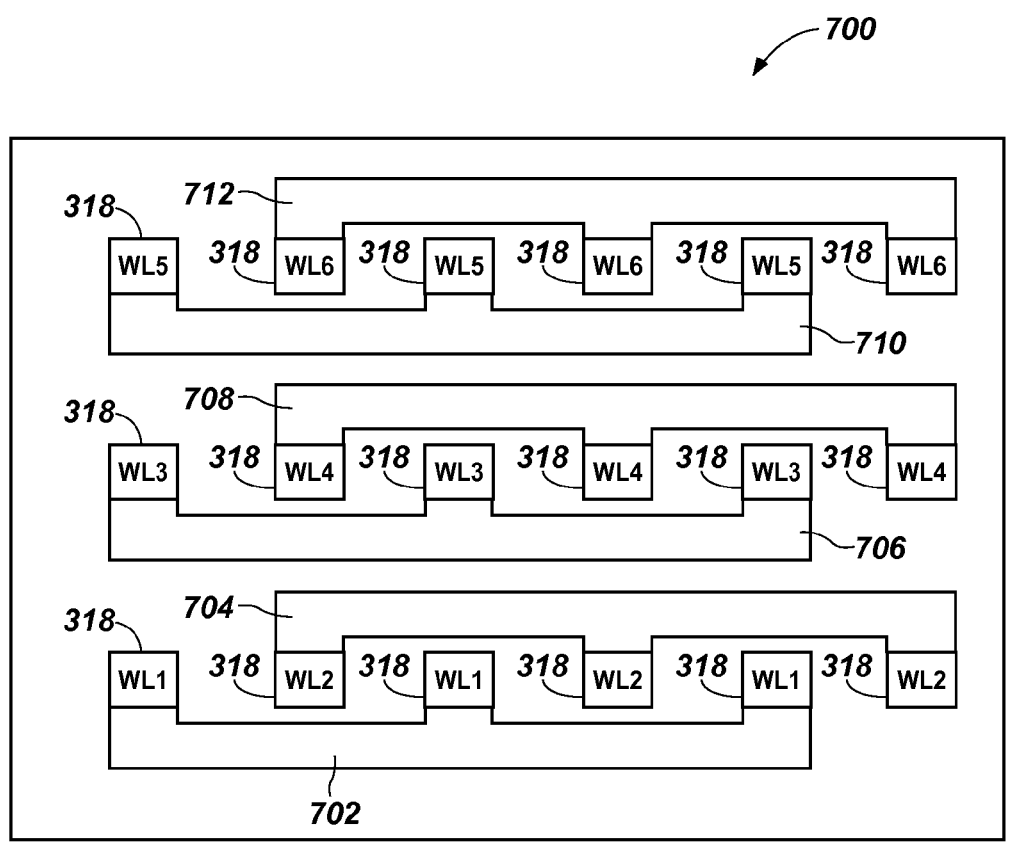

FIG. 7 shows a contacting scheme for a memory array 700 including a plurality of word lines. For example, the memory array 700 may be configured similarly to the memory array 400 of FIG. 4A. The gates 318 along the same x-axis may be part of different word lines. In particular, neighboring gates 318 may be part of the different word lines. For example, the first group of gates 318 along the same x-axis may be part of either word line WL1 or word line WL2. As shown in FIG. 7, the gates 318 may alternate between word line WL1 and word line WL2 moving in the x-direction. Moving back in the z-direction, the second group of gates 318 that are parallel along the same x-axis may be part of either word line WL3 or word line WL4. Moving back yet again in the z-direction, the third group of gates 318 that are parallel along the same x-axis may be part of either word line WL5 or word line WL6.

A first word line contact 702 extends along the memory array 700 such that the first word line contact 702 couples each of the gates 318 that are part of the first word line WL1. A second word line contact 704 extends along the memory array 700 such that the second word line contact 704 couples each of the gates 318 that are part of the second word line WL2. A third word line contact 706 extends along the memory array 700 such that the third word line contact 706 couples each of the gates 318 that are part of the third word line WL3. A fourth word line contact 708 extends along the memory array 700 such that the fourth word line contact 708 couples each of the gates 318 that are part of the fourth word line WL4. A fifth word line contact 710 extends along the memory array 700 such that the fifth word line contact 710 couples each of the gates 318 that are part of the fifth word line WL5. A sixth word line contact 712 extends along the memory array 700 such that the sixth word line contact 712 couples each of the gates 318 that are part of the sixth word line WL6, and so on. Each of the word line contacts 702, 704, 706, 708, 710, 712 may be substantially linear and extend parallel to each other in the x-direction.

To avoid contact with the neighboring gate 318 within a group of gates 318 along the same x-axis, one word line contact (e.g., word line contacts 702, 706, 710) may be offset from the gates 318 in a first direction, while the other word line contact (e.g., word line contacts 704, 708, 712) may be offset from the gates 318 in a second direction. As a result, each of the word line contacts 702, 704, 706, 708, 710, 712 may extend laterally in the z-direction beyond the respective gates 318 rather than aligning directly over the gates 318. Having word line contacts 702, 704, 706, 708, 710, 712 that are at least partially offset rather than extending directly over the gates 318 may increase the pitch of the memory array 700. The increase in pitch, however, may be an appropriate tradeoff for increasing the number of independent memory cells per unit area.

As discussed above, if neighboring gates 318 are part of different word lines, the FeFETs formed on each side of the same bit line may be independently accessible, which may provide for further density and/or capacity in the memory array 700.

Figure 8:
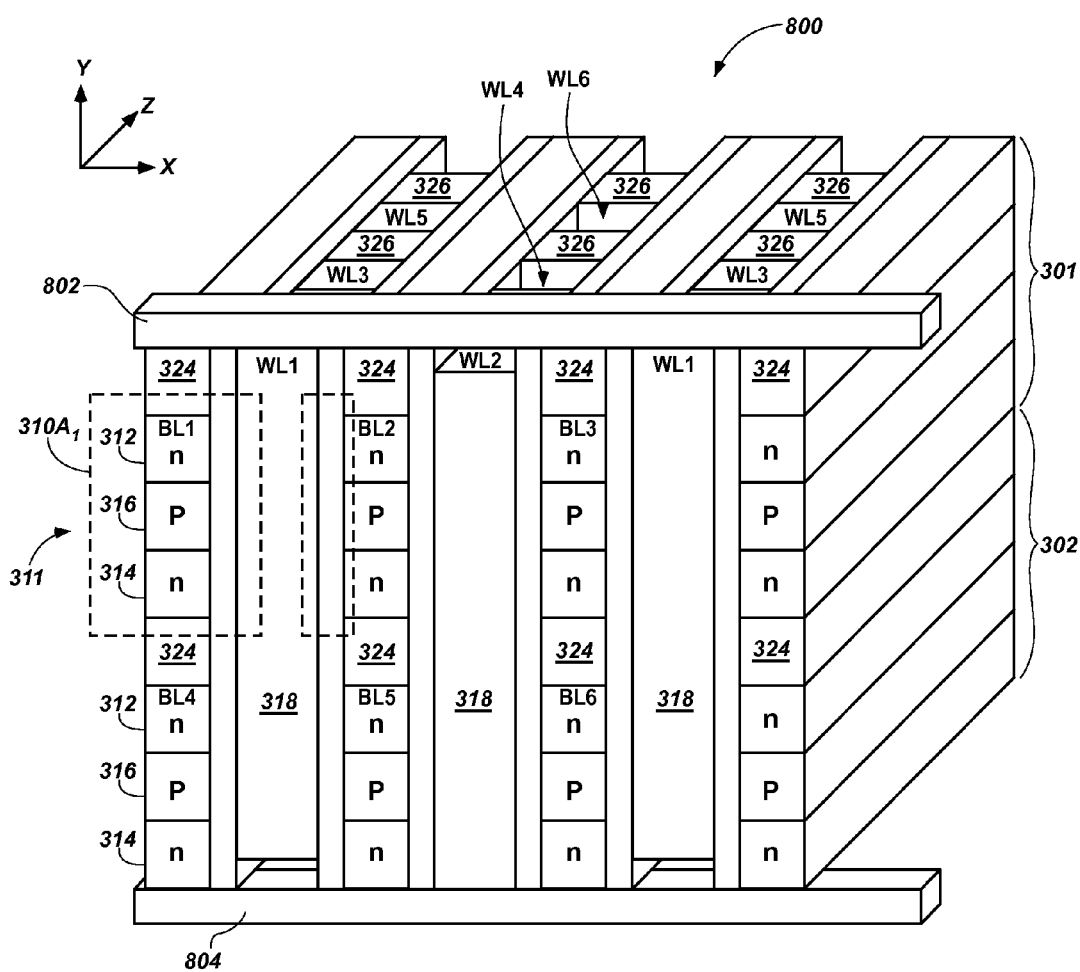
FIG. 8 is a perspective view of a memory array showing a contacting scheme for a memory array that includes a plurality of word lines.

FIG. 8 shows a contacting scheme for a memory array 800 that includes a plurality of word lines. The memory array 800 may be generally configured similarly to the memory array 400 of FIG. 4A. The difference between FIG. 8 and FIG. 4A is in the formation of word lines, and in particular, in the configuration of the gates 318. For example, as with FIGS. 6 and 7, the gates 318 along the same x-axis may be part of different word lines. In particular, neighboring gates 318 may be part of the different word lines. For example, the first group of gates 318 along the same x-axis may be part of either word line WL1 or word line WL2. The gates 318 may alternate between word line WL1 and word line WL2 when moving in the x-direction. Moving back in the z-direction, the second group of gates 318 that are parallel along the same x-axis may be part of either word line WL3 or word line WL4. Moving back yet again in the z-direction, the third group of gates 318 that are parallel along the same x-axis may be part of either word line WL5 or word line WL6.

A first word line contact 802 may extend along the memory array 800 such that the first word line contact 802 couples each of the gates 318 that are part of the first word line WL1. The first word line contact 802 may be substantially linear and may be formed directly over its respective group of gates 318 (similar to FIG. 5). As shown in FIG. 8, however, at least some of the gates 318 in the group in the same x-axis may not couple with the first word line contact 802. In particular, neighboring gates 318 may not couple with the same word line contact 802. Such neighboring gates 318 may be part of a different word line (e.g., word line WL2).

As an example, at least one gate 318 may not fully extend to the end (e.g., top) of the memory array 800 such that the gate 318 does not couple with the first word line contact 802. For example, the gates 318 may alternate when moving along the x-direction, such that every other gate 318 may not extend to the end of the memory array 800. As a result, every other gate 318 in the x-direction will be part of a different word line (e.g., word line WL2). Of course, other word line patterns are contemplated, including patterns that have more than two word lines in the same x-axis, as well as patterns that do not repeat.

Referring still to FIG. 8, the gate 318 that is part of word line WL2 may be coupled with a second word line contact 804 that is coupled to other gates 318 of the word line WL2. Because the memory array 800 is a three gate by three gate 3D memory array architecture, additional gates 318 coupled to word line WL2 are not shown. Such additional gates 318 may be present if the memory array 800 were larger. The second word line contact 804 coupled to the gates 318 of word line WL2 may be formed on the side of the memory array 800 that is opposite the first word line contact 802. The gates 318 of the first word line WL1 may not couple with the second word line contact 804. For example, the gates 318 of the first word line WL1 may not fully extend to the end (e.g., bottom) of the memory array 800 such that the gate 318 does not couple with the second word line contact 804. Similarly, the gates 318 of the second word line WL2 may not couple with the first word line contact 802.

Additional word line contacts (not shown) may be coupled to the gates 318 of additional word lines (e.g., word lines WL3, WL4, WL5, WL6) of the memory array 800. Such additional word line contacts may extend parallel to each other in the x-direction and lay in the x-y plane. According to the embodiment of FIG. 8, gates 318 for odd word lines (e.g., word lines WL3, WL5) may extend to the top of the memory array 800 such that the odd word lines (e.g., word lines WL3, WL5) couple with word line contacts (not shown) that extend along the top of the memory array 800. Gates 318 for even word lines (e.g., word lines WL4, WL6) may not extend fully to the top of the memory array 800 such that the even word lines (e.g., word lines WL4, WL6) may not couple with the word line contacts (not shown) that extend along the top of the memory array 800. Similarly, gates 318 for even word lines (e.g., word lines WL4, WL6) may extend to the bottom of the memory array 800 such that the even word lines (e.g., word lines WL4, WL6) couple with word line contacts (not shown)

that extend along the bottom of the memory array 800. Gates 318 for odd word lines (e.g., word lines WL3, WL5) may not extend fully to the bottom of the memory array 800 such that the odd word lines (e.g., word lines WL3, WL5) may not couple with the word line contacts (not shown) that extend along the bottom of the memory array 800.

As discussed above, if neighboring gates 318 are part of different word lines, the FeFETs formed on each side of the same bit line may be independently accessible, which may provide for further density and/or capacity in the memory array 800.

In some embodiments, an apparatus may comprise a FeFET memory array having a plurality of FeFETs coupled at cross-points of a plurality of access lines. The FeFET memory array may be configured to have a substantially uniform series resistance for a current path regardless of which FeFET of the plurality of FeFETs is selected.

Figure 9:
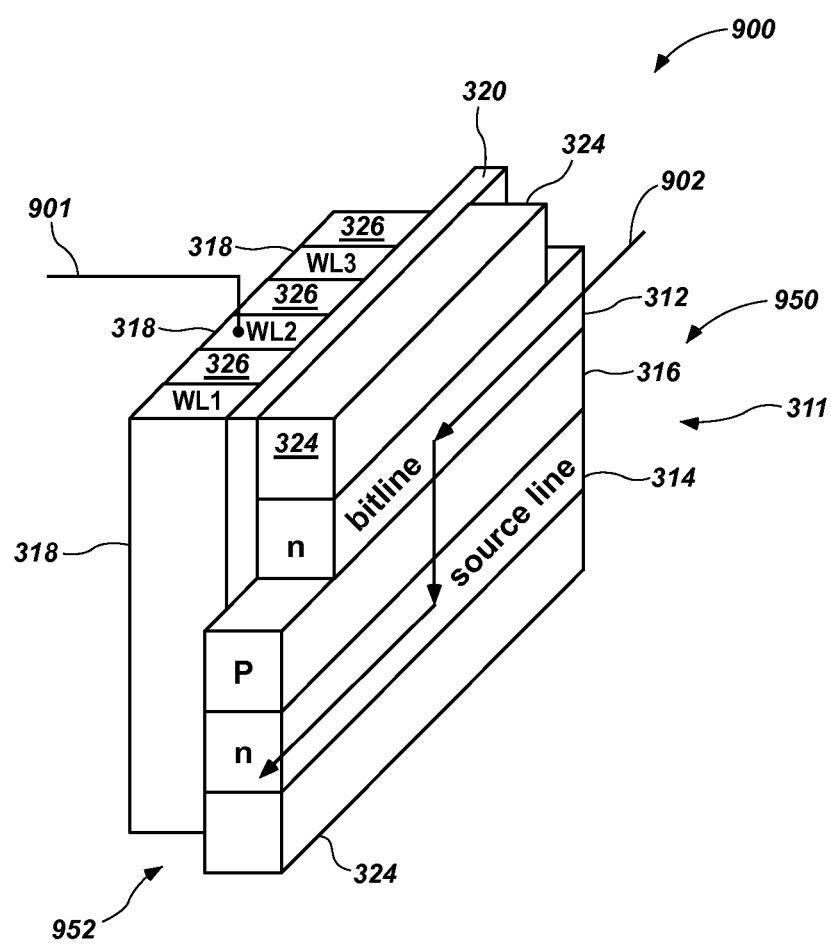
FIG. 9 is a perspective view of a portion of a memory array.

FIG. 9 is a perspective view of a portion of a memory array 900. In particular, the portion of the memory array 900 may include a single FET structure 311 coupled to a ferroelectric material 320 and a plurality of gates 318. The portion of the memory array 900 may be part of a 3D memory array architecture, such as those described above with respect to FIGS. 3A through 8. Therefore, the memory array 900 may include additional FET structures 311 stacked in the various directions needed to form the 3D architecture. For the portion of the memory array 900 shown in FIG. 9, three FeFETs are formed (by the three gates 318 coupled to the FET structure 311 with the ferroelectric material 320); however, the memory array 900 may include additional elements such that any number of FeFETs may be used as memory cells.

In operation, an appropriate combination of voltages may be applied to the contacts (not shown) for the gate 318, source region (source line) 314 and drain region (bit line) 312 in order to access (e.g., sense) the memory cell to determine a state of the memory cell. Current 902 may flow through the bit line 312 and to the source line 314 at the location of the gate 318 receiving an appropriate voltage 901. The current 902 from the source line 314 may be sensed to determine the polarity of the ferroelectric material 320 at the location of the gate 318. As discussed above, the bit line 312 may be coupled to a bit line contact (not shown) and the source line 314 may be coupled to a source line contact (not shown). The bit line contact and the source line contact may be coupled to the respective bit line 312 and source line 314 on opposite ends of the memory array 900. For example, the bit line 312 may couple to the bit line contact at a first end 950 of the memory array 900 (where the arrow representing the current 902 begins). The source line 314 may couple to the source line contact at a second end 952 of the memory array 900 (where the arrow representing the current 902 ends).

With the source line contact and the bit line contact being coupled on opposing ends of the memory array 900, the total path for the current 902 may be approximately the same distance regardless of which word line is accessed. For example, the path for the current 902 may be approximately the same distance if any of word lines WL1, WL2, WL3 are activated. As a result, the series resistance for the current 902 is approximately the same regardless of which memory cell is activated.

Figure 1B:
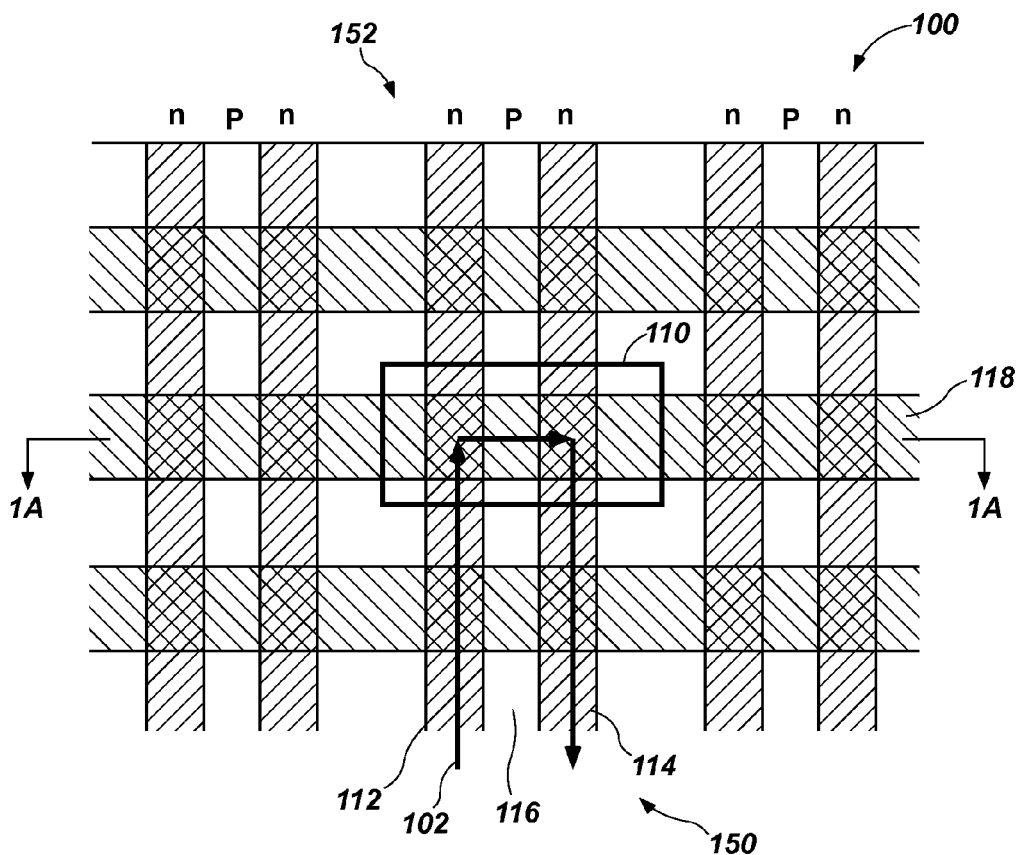

During a read operation, when the threshold voltage of the selected memory cell is sensed, substantially the same threshold is sensed for a given state (e.g., 0 or 1) regardless of where the memory cell is located in the memory array 900. In contrast with FIGS. 1A and 1B, conventional two-dimensional memory arrays may have the bit line and source line contacts on the same end of the memory array. As a result, the series resistance may not be uniform for accessing each memory cell of the memory array, and the threshold voltage for a selected cell will be different depending on the location in the memory array. Therefore, embodiments of the present disclosure that include contacts on opposing sides of the array may be less variable in sensing the threshold voltage during read operations in comparison with conventional two-dimensional memory arrays.

Figure 10:
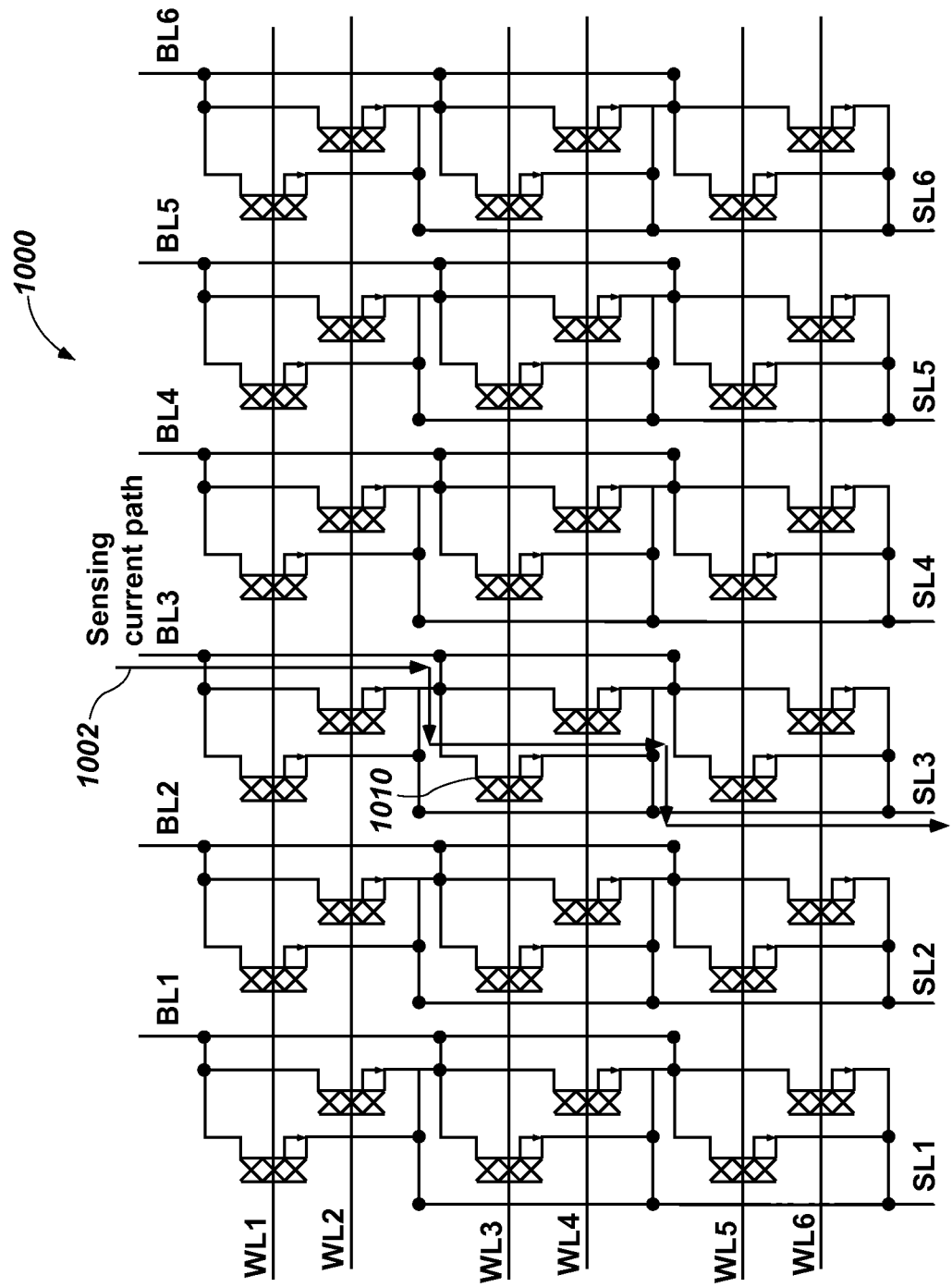
FIG. 10 is a schematic circuit diagram of a portion of a memory array according to an embodiment of the present disclosure.

FIG. 10 is a schematic circuit diagram of a portion of a memory array 1000 according to an embodiment of the present disclosure. The memory array 1000 may include memory cells configured as FeFETs that are located at cross-points of word lines (WL) and bit lines (BL). The physical structure of the memory array 1000 may have a 3D memory array architecture, as discussed above.

As shown in FIG. 10, during an access of a memory cell 1010 of the memory array 1000, a current 1002 may flow from one end of the memory array 1000 to another end of the memory array 1000. Thus, the contacts for the bit lines (BL1-BL6) and source lines (SL1-SL6) may be coupled to opposite ends of the memory array 1000. As a result, the path for the current 1002 may have a uniform series resistance regardless on which memory cell is accessed.

The three-dimensional memory arrays described herein may be included within an apparatus. The apparatus may include a first vertical FeFET stack including a first plurality of gates that are separated from a first vertical FeFET stack by a first ferroelectric material, and a second vertical FeFET stack including a second plurality of gates that are separated from a second vertical FeFET stack by a second ferroelectric material, wherein the first vertical FeFET stack and the second FeFET stack are stacked horizontally and separated by a dielectric material.

The apparatus may further comprise a memory device including the three-dimensional memory array. The apparatus may further comprise an electrical system including the memory device. The apparatus may further comprise a control circuit operably coupled to the memory device, and configured to apply one or more voltages to perform operations on memory cells of the first vertical FeFET stack and the second vertical FeFET stack. The apparatus may further comprise an input device and an output device operably coupled to the control circuit.

Figure 11:
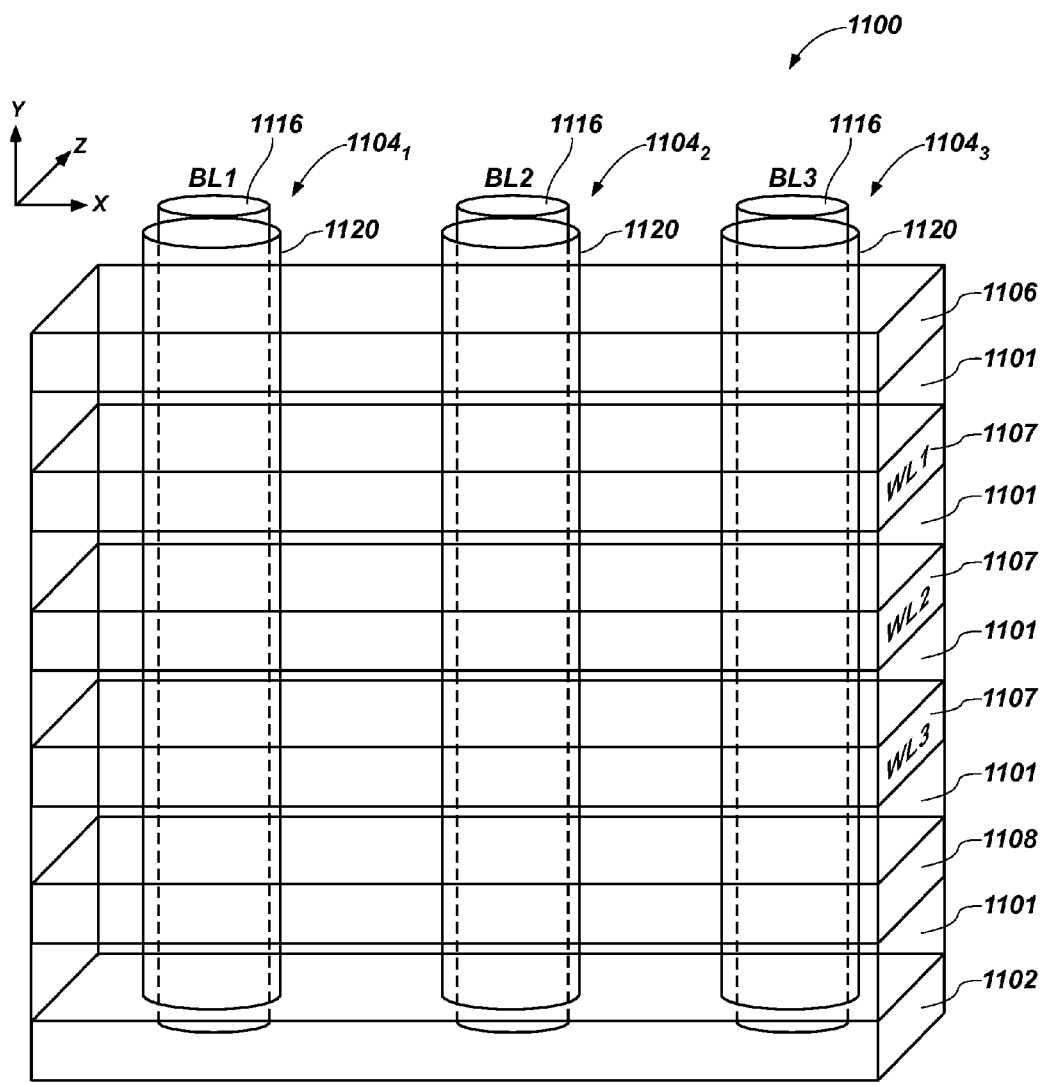
FIG. 11 is a perspective view of a schematic diagram of a portion of a memory array according to another embodiment of the present disclosure.

FIG. 11 is a perspective view of a schematic diagram of a portion of a memory array 1100 according to another embodiment of the present disclosure. The memory array 1100 may be configured in a 3D-NAND type configuration, in which a plurality of vertical strings 1104$_1$, 1104$_2$, 1104$_3$ of memory cells are formed on a substrate 1102. Each vertical string 1104$_1$, 1104$_2$, 1104$_3$ may be coupled to an upper select gate 1106 (e.g., drain select gate) on a first end and to a lower select gate 1108 (e.g., source select gate) on a second end. The memory array 1100 may include a plurality of memory cell gates 1107 coupled with the vertical strings 1104$_1$, 1104$_2$, 1104$_3$ between the upper select gate 1106 and the lower select gate 1108. As a result, the vertical strings 1104$_1$, 1104$_2$, 1104$_3$ may extend vertically and orthogonal to the upper select gate 1106, the memory cell gates 1107, and the lower select gate 1108. The upper select gate 1106, the memory cell gates 1107, and the lower select gate 1108 may be separated by an insulation material 1101, such as a dielectric material (e.g., oxide).

Each vertical string 1104$_1$, 1104$_2$, 1104$_3$ may include a vertical channel 1116 that passes through, and couples with, the upper select gate 1106, the lower select gate 1108, and the memory cell gates 1107 therebetween. The vertical channel 1116 may be formed of poly-silicon. The vertical channels 1116 may be surrounded by a ferroelectric material 1120. As a result, individual FeFET memory cells may be formed at the intersection of the vertical channel 1116 and the memory cell gate 1107. The memory cell gates 1107 may be coupled to different word lines WL1, WL2, WL3 to select a particular row of the memory array 1100. The vertical channels 1116 may be coupled to a bit line BL1, BL2, BL3 through an N diffusion region to select a particular column of the memory array 1100. The substrate 1102 may be coupled to a source line. In operation, when a memory cell is accessed, the ferroelectric material at the selected intersection may exhibit a polarization that is interpreted as the state of the memory cell as described above.

The memory array 1100 of FIG. 11 is a simplified schematic diagram, and it should be recognized that additional elements may be coupled therewith to facilitate operation thereof For example, access lines (e.g., word lines, bit lines, select lines) and other contact elements may be coupled with the memory array 1100 for applying voltages to the various elements of the memory array 1100 to perform operations (e.g., read, write, erase, etc.) thereon. For example, select lines may be coupled with the select gates 1106, 1108. Word lines may be coupled with the memory cell gates 1107, and bit lines may be coupled with the vertical strings $1104_1$, $1104_2$, $1104_3$. The memory array 1100 may also include a control unit (not shown) that is coupled with the select gates 1106, 1108, the memory cell gates 1107, and the vertical strings $1104_1$, $1104_2$, $1104_3$. Such a control unit may include at least one of string driver circuitry, pass gates, circuitry for selecting gates, circuitry for selecting conductive lines (e.g., bit lines, word lines), circuitry for amplifying signals, and circuitry for sensing signals.

Although the memory array 1100 only shows FeFET memory cells in a single x-y plane, showing such a 2D portion of the memory array 1100 may be for convenience of illustration. The memory array 1100 may be a 3D memory array 1100. For example, each of the select gates 1106, 1108, the memory cell gates 1107, substrate 1102, and insulation material 1101 may extend into the z-direction such that additional vertical strings may be formed at additional locations along the z-direction such that a 3D structure (e.g., cube, cuboid) is formed. In other words, the select gates 1106, 1108 and the memory cell gates 1107 may be configured as conductive plates that are substantially planar, such that an array of vertical strings may pass through openings (e.g., holes) formed through the conductive plates for coupling therewith.

Figure 12:
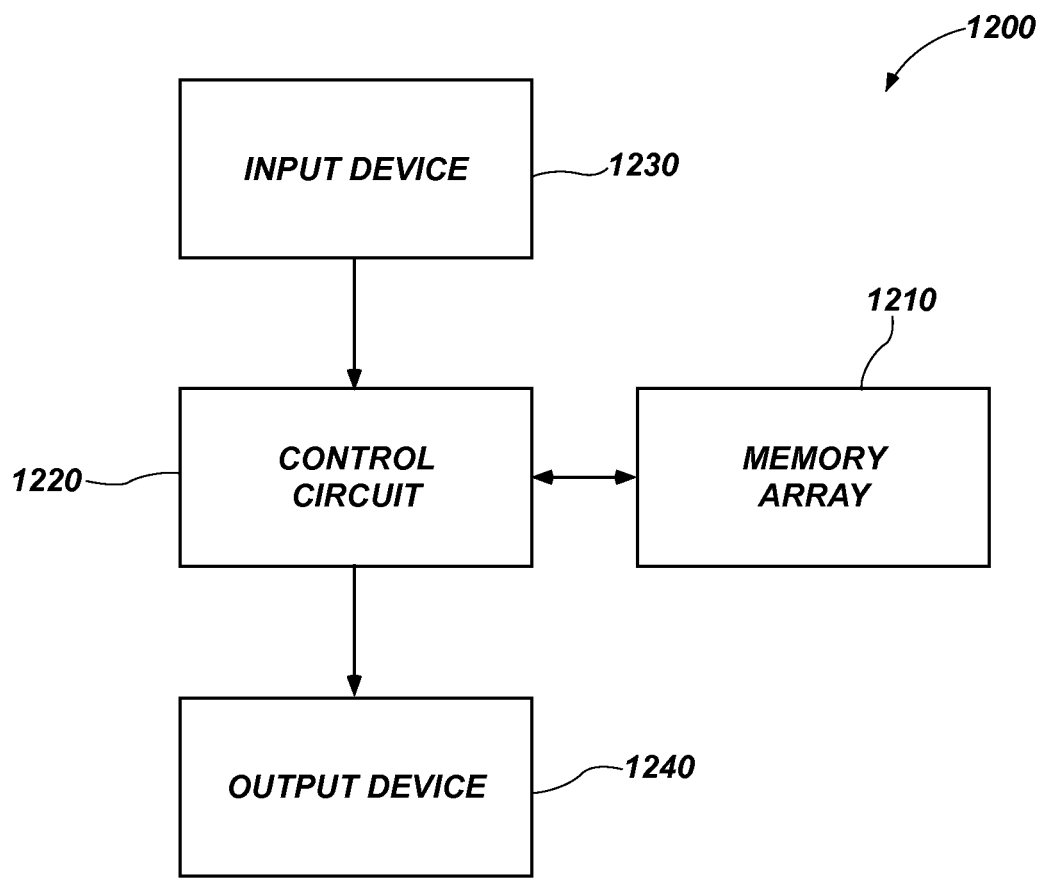
FIG. 12 is a simplified block diagram of an electrical system including a vertical memory cell.

FIG. 12 is a simplified block diagram of an electrical system 1200 including a vertical memory cell. The electrical system 1200 may include a memory array 1210, a control circuit 1220, an input device 1230, and an output device 1240 that are operably coupled to communicate with each other through the control circuit 1220. The memory array 1210 may include a plurality of memory cells configured as FeFETs and arranged in a 3D architecture. In general, the memory array 1210 may include any combination of features of the memory arrays described herein, and their equivalents. The memory array 1210 may be included within a memory device, a semiconductor wafer, or other similar apparatus.

The control circuit 1220 may be configured to control the memory array 1210. The control circuit 1220 may include one or more device from the group consisting of a processor, a hard disk drive, and an optical disc drive (not shown). The control circuit 1220 may be operably coupled to the bit lines 312 (FIG. 9), the source lines 314 (FIG. 9), and the gates 318 (FIG. 9) in order to perform desired operations (e.g., read, write, erase) on the memory array 1210.

The control circuit 1220 may also be operably coupled to the input device 1230, and the output device 1240. By way of non-limiting example, the input device 1230 may include any of a keyboard, a button array, a mouse device, a touch screen input, other similar devices, and combinations thereof The control circuit 1220 may be configured to receive and execute commands, and receive information, from the input device 1230.

The output device 1240 may include, by way of non-limiting example, any of a liquid crystal display (LCD) device, a light emitting diode (LED) array, a cathode ray tube (CRT) display, a sound generating device, an electrical signal output port, other similar devices, and combinations thereof. The control circuit 1220 may be configured to cause the output device 1240 to communicate information to a user (not shown) or another device (not shown).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. An apparatus, comprising:
   a plurality of field-effect transistor (FET) structures stacked horizontally and vertically in a three-dimensional memory array architecture;
   a plurality of gates extending vertically and spaced horizontally between the plurality of FET structures; and
   a ferroelectric material separating the plurality of FET structures and the plurality of gates, wherein:
   individual ferroelectric FETs (FeFETs) are located at intersections of the plurality of FET structures, the plurality of gates, and the ferroelectric material; and
   the ferroelectric material is shared by FeFETs of a same vertical FeFET stack.

2. The apparatus of claim 1, wherein each FET structure of the plurality of FET structures includes a drain region, a body region, and a source region stacked in a vertical arrangement.

3. The apparatus of claim 2, further comprising a plurality of access lines coupled with individual FeFETs.

4. The apparatus of claim 3, wherein the plurality of access lines includes:
   a plurality of word lines coupled to the plurality of gates; and
   a plurality of bit lines coupled to the drain regions of the plurality of FET structures.

5. The apparatus of claim 4, wherein the plurality of word lines couple to the plurality of gates according to an alternating contact scheme.

6. The apparatus of claim 2, wherein each FET structure further comprises:
   a drain contact coupled to the drain region; and
   a source contact coupled to the source region, wherein the drain contact and the source contact are coupled on opposite ends of the three-dimensional memory array architecture.

7. The apparatus of claim 6, wherein the source contact is further coupled to the body region of the corresponding FET structure.

8. The apparatus of claim 1, wherein each gate of the plurality of gates has the ferroelectric material disposed on at least one side of the gate.

9. The apparatus of claim 1, wherein at least some of the gates of the plurality of gates have the ferroelectric material disposed on at least two sides of the gate.

10. An apparatus, comprising:
a first vertical ferroelectric field-effect transistor (FeFET) stack including a first plurality of gates separated from a first FET structure by a first ferroelectric material; and
a second vertical FeFET stack including a second plurality of gates separated from a second FET structure by a second ferroelectric material, wherein:
the first vertical FeFET stack and the second vertical FeFET stack are stacked horizontally and separated by a dielectric material; and
the first ferroelectric material is shared by FeFETs of the first vertical FeFET stack and the second ferroelectric material is shared by FeFETs of the second vertical FeFET stack.

11. The apparatus of claim 10, wherein the dielectric material includes a third ferroelectric material configured such that the second vertical FeFET stack has memory cells on both sides of the second FET structure of the second vertical FeFET stack.

12. The apparatus of claim 11, wherein neighboring gates from the first plurality of gates and the second plurality of gates along the same horizontal axis are part of the same word line.

13. The apparatus of claim 12, further comprising a plurality of word line parallel contacts that extend linearly across the first vertical FeFET stack and the second vertical FeFET stack, wherein a single word line contact couples the neighboring gates from the first plurality of gates and the second plurality of gates along the same horizontal axis.

14. The apparatus of claim 11, wherein neighboring gates from the first plurality of gates and the second plurality of gates along the same horizontal axis are part of different word lines.

15. The apparatus of claim 14, further comprising a plurality of additional vertical FeFET stacks that include additional pluralities of gates, the additional vertical FeFET stacks stacked horizontally with the first vertical FeFET stack and the second vertical FeFET stack.

16. The apparatus of claim 15, further comprising a plurality of mutually parallel word line contacts that extend along the first vertical FeFET stack, the second vertical FeFET stack, and the plurality of additional vertical FeFET stacks, wherein neighboring gates from the first plurality of gates and the second plurality of gates along the same horizontal axis couple to different ones of the mutually parallel word line contacts.

17. The apparatus of claim 16, wherein:
one of the neighboring gates extends to a first end of the first vertical FeFET stack, and couples with a first one of the mutually word line contact; and
another of the neighboring gates extends to a second end of the second vertical FeFET stack, and couples with a second one of the mutually word line contact.

18. The apparatus of claim 16, wherein the plurality of word line contacts are offset from the first plurality of gates and the second plurality of gates, and further extend linearly across the first vertical FeFET stack, the second vertical FeFET stack, and the plurality of additional vertical FeFET stacks.

19. The apparatus of claim 16, wherein the plurality of word line contacts each has an arcuate shape that extends around one of the neighboring gates.

20. The apparatus of claim 10, wherein the first vertical FeFET stack and the second vertical FeFET stack comprise a portion of a three dimensional memory array of the apparatus.

21. The apparatus of claim 20, wherein the three-dimensional memory array comprises at least a portion of a memory device of the apparatus.

22. The apparatus of claim 21, wherein the memory device comprises at least a portion of the apparatus.

23. The apparatus of claim 22, further comprising a control circuit operably coupled to the memory device, and configured to apply one or more voltages to perform operations on memory cells of the first vertical FeFET stack and the second vertical FeFET stack.

24. he apparatus of claim 23, further comprising an input device and an output device operably coupled to the control circuit.

25. An apparatus, comprising:
a ferroelectric field-effect transistor (FeFET) memory array having a plurality of FeFETs coupled at crosspoints of a plurality of access lines, wherein the FeFET memory array is configured to have a substantially uniform series resistance for a current path for each FeFET of the plurality of FeFETs.

26. The apparatus of claim 25, further comprising:
a plurality of bit line contacts coupled to bit lines of the plurality of FeFETs;
a plurality of source line contacts coupled to source lines of the plurality of FeFETs; and
a plurality of word line contacts coupled to word lines of the plurality of FeFETs, wherein the bit line contacts and the source line contacts are coupled on opposing ends of the FeFET memory array.

27. An apparatus, comprising:
a three-dimensional memory array having a plurality of ferroelectric field-effect transistor (FeFET) memory cells located at intersections of ferroelectric material coupled with a plurality of bit lines and a plurality of word lines, wherein:
the plurality of FeFET memory cells are located along vertical strings of the three-dimensional memory array; and
the ferroelectric material is shared by the plurality of FeFET memory cells along the vertical strings.

28. The apparatus of claim 27, wherein each bit line of the plurality of bit lines are coupled to a drain region that has at least two sides coupled with the ferroelectric material such that each drain region is shared by neighboring gates to form the plurality of FeFET memory cells.

29. The apparatus of claim 28, wherein the neighboring gates and word lines are configured to independently access the plurality of FeFETs associated with the same bit line.

30. The apparatus of claim 27, wherein the vertical strings couple with memory cell gates coupled with the plurality of word lines.

31. The apparatus of claim 30, wherein the vertical strings each include a vertical channel surrounded by the ferroelectric material.

32. A method of operating a three-dimensional ferroelectric field-effect transistor (FeFET) memory array, the method comprising:
applying a combination of voltages to a plurality of word lines and digit lines for a desired operation for a plurality of FeFET memory cells of a three-dimensional FeFET memory array, at least one digit line having a plurality of FeFET memory cells accessible by neighboring gates through shared ferroelectric material.

33. The method of claim 32, wherein applying a combination of voltages comprises employing a selection scheme from the group consisting of a V/3 selection scheme and a V/2 selection scheme.

* * * * *

UNITED STATES PATENT AND TRADEMARK OFFICE
CERTIFICATE OF CORRECTION

PATENT NO.       : 9,281,044 B2                     Page 1 of 1
APPLICATION NO.  : 13/897037
DATED            : March 8, 2016
INVENTOR(S)      : D. V. Nirmal Ramaswamy et al.

It is certified that error appears in the above-identified patent and that said Letters Patent is hereby corrected as shown below:

On the title page:
In ITEM (57) ABSTRACT:
LINE 11,    change "to faun a" to --to form a--

In the specification:
COLUMN 4,   LINE 51,    change ""0, " as long" to --"0," as long--
COLUMN 15,  LINE 17,    change "thereof For" to --thereof. The--
COLUMN 16,  LINE 5,     change "thereof For" to --thereof. The--

In the claims:
CLAIM 2,    COLUMN 16,  LINE 46,    change "verticalarrangement." to --vertical arrangement.--
CLAIM 20,   COLUMN 18,  LINE 6,     change "three dimensional" to --three-dimensional--
CLAIM 24,   COLUMN 18,  LINE 17,    change "he apparatus" to --The apparatus--

Signed and Sealed this
Seventeenth Day of May, 2016

Michelle K. Lee
*Director of the United States Patent and Trademark Office*